United States Patent [19]
Tada

[11] Patent Number: 5,155,068
[45] Date of Patent: Oct. 13, 1992

[54] METHOD FOR MANUFACTURING AN IC MODULE FOR AN IC CARD WHEREBY AN IC DEVICE AND SURROUNDING ENCAPSULANT ARE THINNED BY MATERIAL REMOVAL

[75] Inventor: Noburu Tada, Yamatokoriyama, Japan

[73] Assignee: Sharp Kabushiki Kaisha, Osaka, Japan

[21] Appl. No.: 818,469

[22] Filed: Jan. 6, 1992

Related U.S. Application Data

[62] Division of Ser. No. 574,142, Aug. 29, 1990, abandoned.

[30] Foreign Application Priority Data

Aug. 31, 1989 [JP] Japan ................................. 1-226460

[51] Int. Cl.$^5$ ..................... H01L 21/52; H01L 21/56; H01L 21/60
[52] U.S. Cl. .................................. 437/211; 437/219; 437/966; 437/974
[58] Field of Search .............................. 357/80, 74, 72; 235/492, 487, 489, 488; 361/398; 437/211, 219, 250, 966, 974

[56] References Cited

U.S. PATENT DOCUMENTS

| | | | |
|---|---|---|---|
| 3,702,464 | 11/1972 | Castrucci | 357/74 |
| 4,532,419 | 7/1985 | Takeda | 357/74 |
| 4,603,249 | 7/1986 | Hoppe et al. | 357/80 |
| 4,725,924 | 2/1988 | Juan | 357/80 |
| 4,774,633 | 9/1988 | Dehaine et al. | 357/80 |
| 4,803,542 | 2/1989 | Haghiri-Tehrani et al. | 357/80 |
| 4,822,989 | 4/1989 | Miyamoto et al. | 357/72 |
| 4,931,853 | 6/1990 | Ohuchi et al. | 357/80 |

FOREIGN PATENT DOCUMENTS

| | | | |
|---|---|---|---|
| 62-147735 | 7/1987 | Japan | 437/219 |
| 5599/1990 | 2/1990 | Japan | |

Primary Examiner—Olik Chaudhuri
Assistant Examiner—David E. Graybill
Attorney, Agent, or Firm—Nixon & Vanderhye

[57] ABSTRACT

An IC card comprising a card body having a concave position provided on one of surfaces thereof and an IC module fitted into the concave portion, wherein the IC module includes a very thin LSI having an active device and metallic wire layers formed on a semiconductor substrate, electrodes for connection formed on the metallic wire layers, external connecting terminals having the electrodes for connection connected to the back faces thereof and a resin for fixing the very thin LSI onto the back faces of the external connecting terminals, and the semiconductor substrate of the very thin LSI substantially exists but is made thin like a film so that the IC module is very thin entirely.

2 Claims, 2 Drawing Sheets

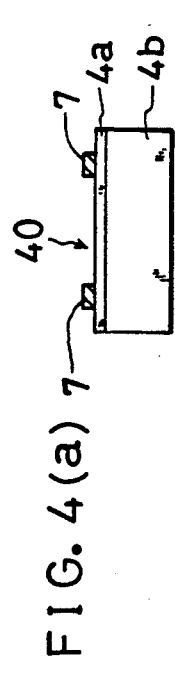
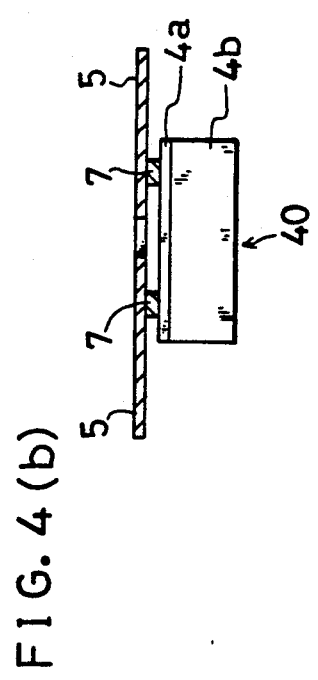
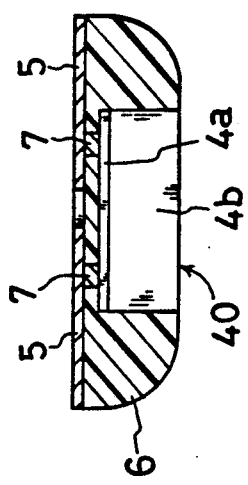
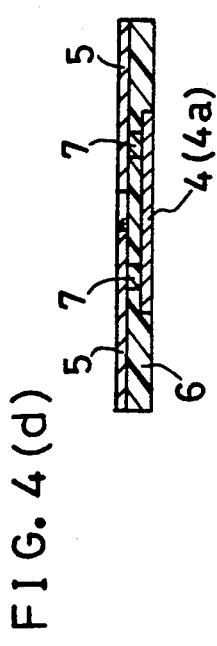
FIG. 4(a)
FIG. 4(b)
FIG. 4(c)
FIG. 4(d)
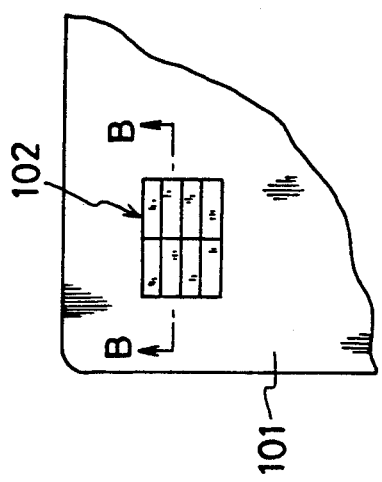
FIG. 5 (PRIOR ART)
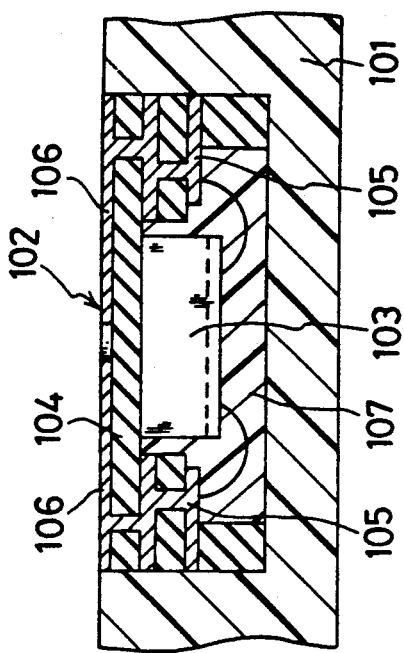
FIG. 6 (PRIOR ART)

METHOD FOR MANUFACTURING AN IC MODULE FOR AN IC CARD WHEREBY AN IC DEVICE AND SURROUNDING ENCAPSULANT ARE THINNED BY MATERIAL REMOVAL

This is a division of application Ser. No. 071574,142, filed Aug. 29, 1990, now abandoned.

BACKGROUND OF THE INVENTION

1. Field of the Invention

The present invention relates to an IC card having an LSI such as a microprocessor, a memory or the like built therein, and more particularly to an IC card in which the built-in LSI is extremely thin.

2. Description of the Prior Art

In general, an IC card is a plastic card which comprises a microprocessor and a memory therein and takes the size of a credit card (85.5×54×0.76 mm). The IC card is superior in capacity of memory, security and the like, as compared with a magnetic tape which is currently mainstream. Therefore, it is expected that the IC card will become mainstream in the coming generation.

As shown in FIG. 5, the IC card has an IC module 102 fitted into a concave portion of a card body 101. The IC module 102 has the structure shown in FIG. 6 generally, in which an LSI chip 103 is provided in the concave portion on the back face of a PC substrate 104, electrodes of the LSI chip 103 are bonded to terminals 105 on the back face of the PC substrate 104 by a wire to conduct to external connecting terminals 106 on the surface of the IC module 102 and further the LSI chip 103 is molded by a resin 107.

As described above, the card body 101 must have a thickness of 0.76 mm (a tolerance of ±0.08 mm). For this reason, it is required to use the LSI chip which is made by abrading an LSI chip 0.5 mm thick for general electronic equipment to have a thickness of about 0.3 mm.

However, the LSI chip 103 of which thickness is about 0.3 mm has a fragile silicon substrate. Therefore, even if the strength is enhanced by the mold resin 107, the LSI chip 103 may be easily broken by external stress in an actual using environment and is not reliable.

The IC card will have the same value as that of money if it is widespread. Therefore, the above-mentioned problem can not be ignored and should be solved in its early stages.

SUMMARY OF THE INVENTION

The present invention provides an IC card comprising a card body having a concave portion provided on one of surfaces thereof and an IC module fitted into the concave portion, wherein the IC module includes a very thin LSI having an active device and metallic wire layers formed on a semiconductor substrate, electrodes for connection formed on the metallic wire layers, external connecting terminals having the electrodes for connection connected to the back faces thereof and a resin for fixing the very thin LSI onto the back faces of the external connecting terminals, and the semiconductor substrate of the very thin LSI substantially exists but is made thin like a film so that the IC module is very thin entirely.

The present invention provides an IC card of which an LSI is not broken by external stress in an actual using environment and which has high reliability.

BRIEF DESCRIPTION OF THE DRAWINGS

FIGS. 4 (a) to (d) are views for explaining a step of fabricating an IC module used in the embodiment;

FIG. 5 is a partial plan view of the conventional IC card; and

FIG. 6 is an enlarged partially cross-sectional view taken along the line B—B of FIG. 5.

DETAILED DESCRIPTION OF PREFERRED EMBODIMENT

There will be described an embodiment of the present invention.

Figure 1:
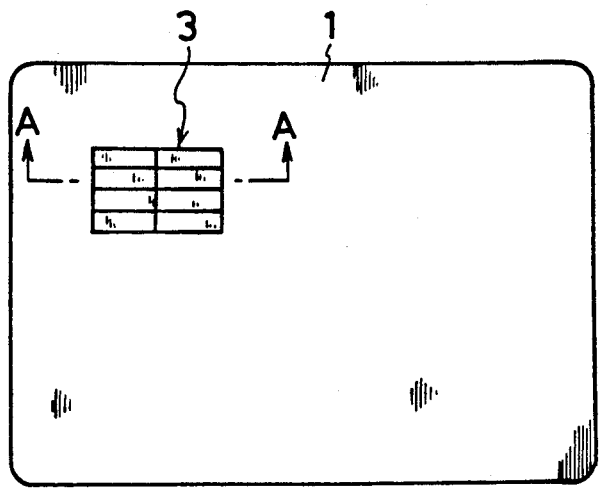
FIG. 1 is a plan view of one embodiment according to the present invention.
Figure 2:
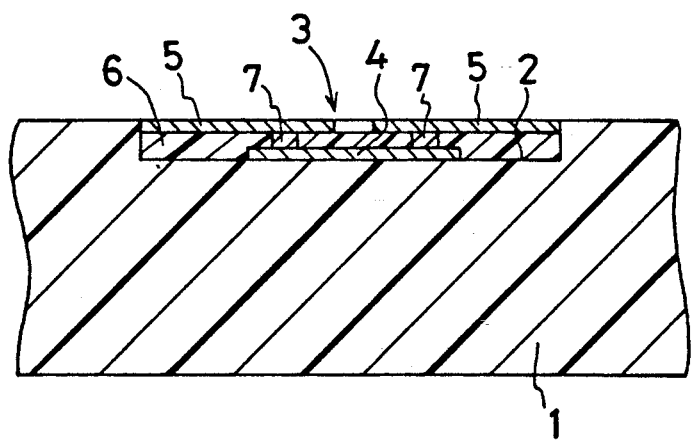
FIG. 2 is an enlarged partially cross-sectional view taken along the line A—A of FIG. 1.

FIG. 1 is a plan view of an IC card according to one embodiment of the present invention. FIG. 2 is an enlarged partially cross-sectional view taken along the line A—A of FIG. 1. A card body 1 made of plastic takes the size of a credit card (85.5×54×0.76 mm) is similar to the conventional IC card and has an IC module 3 fitted into a concave portion 2 on the surface thereof.

The IC module 3 includes a very thin LSI 4 about 5 mm square, a plurality of gold-plated external connecting terminals 5, bump electrodes 7 for electrically connecting the very thin LSI 4 with the external connecting terminals 5 and a resin 6 for fixing the very thin LSI 4 onto the back faces of the external connecting terminals 5. The very thin LSI 4 is formed by abrading a silicon substrate 4b, as shown in FIGS. 4b and 4d, so that an active device remains and the silicon substrate 4b substantially exists but is made extremely thin like a film. Preferably, the very thin LSI 4 has a thickness of about 1 $\mu$m. If abrading is performed until the very thin LSI 4 has the thickness of about 1 $\mu$m, the strength is lowered. However, since bending deformation and restoration can be obtained, the very thin LSI 4 is not broken by stress. The very thin LSI 4 has a plurality of bump electrodes 7 formed on top surfaces of metallic wire layers 4c of an active device 4a. The bump electrodes 7 are connected to the back faces of the external connecting terminals 5, respectively.

Figure 3:
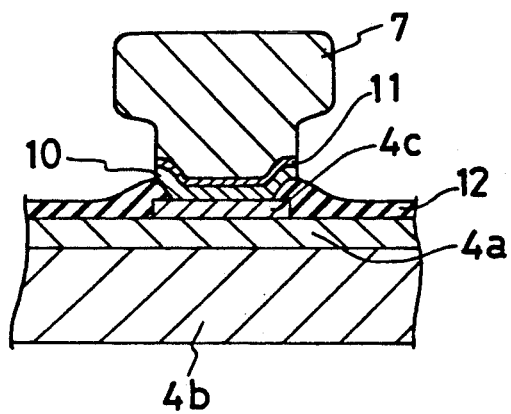
FIG. 3 is an enlarged cross-sectional view of a main portion showing the structure of a bump electrode.

As shown in FIG. 3, the bump electrodes 7 are formed through Ti-W films 10 and Au films 11 deposited on the metallic wire layers 4c. In FIG. 3, the numeral 12 denotes an insulating film. The bump electrodes 7 are made of gold. The metallic wire layers 4c are made of aluminum.

The IC module 3 having the above structure can be easily fabricated, for example, in the same way as shown in FIG. 4. As shown in FIG. 4 (a), an LSI base chip 40 having a thickness of about 0.5 mm is made by forming the active device 4a on the silicon substrate 4b. By means of the LSI base chip 40, the bump electrodes 7 are formed on the metallic wire layers 4c arranged of the surface of the active device 4a by plating. As shown in FIG. 4 (b), the bump electrodes 7 are connected to the back faces of the external connecting terminals 5, respectively. The external connecting terminals 5 can be connected to the bump electrodes 7 by Au—Au eutectic preparation at a temperature of about 400° C. or by heat curing conductive paste, for example, Ag paste at a temperature of about 200° C.

Then, the epoxy or acrylic resin 6 is coated on the periphery of the LSI base chip 40 to be fixed onto the back faces of the external connecting terminals 5 as shown in FIG. 4 (c). After the resin 6 is cured, the silicon substrate 4b is abraded along with the resin 6 by an abrasive pad with the external connecting terminals 5 supported. The abrading is mechanically performed by abrasive grain until the thickness of the LSI base chip 40 is about 50 μm. Thereafter, dissolving is chemically performed by means of etchant such as amines or hydrazine until the thickness of the LSI base chip 40 is about 1 μm. When the LSI base chip 40 is abraded to become extremely thin as described above, the silicon substrate 4b is removed almost completely to become thin like a film. As shown in FIG. 4 (d), there can be obtained the IC module 3 having the very thin LSI 4 in which only the active device 4a remains. The IC module 3 is finally fitted into the concave portion of the card body 1 by means of an epoxy adhesive. Consequently, the IC card of the present invention is completed.

On the other hand, the very thin LSI may be formed by a process described hereafter. Before preparing the LSI base chip 40, a wafer is mechanically abraded. Then, the wafer is chemically dissolved by means of the above etchant so as to become extremely thin. Consequently, the very thin LSI 4 can be formed. The mechanical abrading can be performed by means of a lapping machine used in preparing the wafer.

Furthermore, a beam lead electrode can be used as an electrode for connection instead of the bump electrode in the above embodiment.

The IC card mentioned above is very thin because the LSI 4 provided on the IC module 3 has the thickness of about 1 μm. Therefore, the IC card is excellent in bending deformation and has restoration. Accordingly, the very thin LSI 4 can be easily bent and deformed according to the stress in an actual using environment. If the stress is eliminated, the very thin LSI 4 is restored. For this reason, there is little possibility that the very thin LSI 4 is broken by the stress in the actual using environment. Consequently, the IC card has high reliability.

As seen from the above-mentioned matter, the IC card of the present invention has a noticeable effect that the very thin LSI is not broken by the stress in the actual using environment and that the reliability can be enhanced considerably.

What is claimed is:

1. A method of manufacturing an IC module for an IC card comprising steps of:
    forming an active device and metallic wire layers on a semiconductor substrate to make an LSI base chip;
    forming electrodes for connection on the metallic wire layers;
    connecting the electrodes for connection to the back faces of external connecting terminals;
    fixing the LSI base chip onto the back faces of the external connecting terminals by coating the periphery of the LSI base chip and the back faces of the external connecting terminals with a resin to be cured; and
    dissolving the semiconductor substrate of the LSI base chip along with the resin until the semiconductor substrate substantially exists but is made thin like a film.

2. A method of manufacturing an IC module for an IC card according to claim 1, wherein bump electrodes as the electrodes for connection are formed on the metallic wire layers by gold-plating.

* * * * *